US 7,999,529 B2

(12) United States Patent
Thorp

(10) Patent No.: US 7,999,529 B2
(45) Date of Patent: Aug. 16, 2011

(54) METHODS AND APPARATUS FOR GENERATING VOLTAGE REFERENCES USING TRANSISTOR THRESHOLD DIFFERENCES

(75) Inventor: Tyler Thorp, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 209 days.

(21) Appl. No.: 12/395,198

(22) Filed: Feb. 27, 2009

(65) Prior Publication Data

US 2010/0219804 A1      Sep. 2, 2010

(51) Int. Cl.
G05F 3/26         (2006.01)
G05F 3/28         (2006.01)

(52) U.S. Cl. .................... 323/313; 323/315; 323/316

(58) Field of Classification Search ............... 323/311, 323/313, 315, 316
See application file for complete search history.

(56) References Cited

U.S. PATENT DOCUMENTS

| | | | | |
|---|---|---|---|---|
| 5,221,864 | A * | 6/1993 | Galbi et al. | 327/537 |
| 5,635,869 | A * | 6/1997 | Ferraiolo et al. | 327/543 |
| 5,838,191 | A | 11/1998 | Opris et al. | |
| 6,133,718 | A * | 10/2000 | Calafato et al. | 323/312 |
| 7,109,785 | B2 * | 9/2006 | Derksen | 327/543 |
| 2005/0083029 | A1 * | 4/2005 | Moraveji | 323/315 |
| 2006/0001412 | A1 | 1/2006 | Fernald | |
| 2008/0224632 | A1 * | 9/2008 | Noda | 315/291 |
| 2009/0201006 | A1 * | 8/2009 | Mitani et al. | 323/315 |

OTHER PUBLICATIONS

Blauschild, et al., "A New NMOS Temperature-Stable Voltage Reference," IEEE Journal of Solid-State Circuits, Dec. 1978, pp. 767-774, vol. SC-13, No. 6.
Oguey et al., "MOS Voltage Reference Based on Polysilicon Gate Work Function Difference," IEEE Journal of Solid-State Circuits, Jun. 1980, pp. 264-269, vol. SC-15, No. 3.
Vittoz et al., "A Low-Voltage CMOS Bandgap Reference," IEEE Journal of Solid-State Circuits, Jun. 1979, pp. 573-577, vol. SC-14, No. 3.
Widlar, "New Developments in IC Voltage Regulators," IEEE Journal of Solid-State Circuits, Feb. 1971, pp. 2-7, vol. SC-6, No. 1.
International Search Report and Written Opinion of International Application No. PCT/US2010/024764 mailed Jun. 28, 2010.
Opris et al., "Bias Optimization for Switched Capacitor Amplifiers", Dec. 1, 1997, IEEE Transactions on Circuits and Systems II: Analog and Digital Signal Processing, vol. 44, No. 12, pp. 985-989.
Seo et al., "Low-Power CMOS On-Chip Voltage Reference Using MOS PTAT: An EP Approach", Sep. 1997, ASIC Conference and Exhibit, Tenth Annual IEEE International Proceedings, pp. 316-320.
Gunther et al., "A Low Voltage Programmable Gain Amplifier for DC to Medium Frequency Applications with Small Die Size", Apr. 2006, Proceedings of the 6th International Caribbean Conference on Devices, Circuits and Systems, IEEE, pp. 85-90.
Chen et al., "Novel Constant Transconductance References and the Comparisons with the Traditional Approach", Feb. 2003, Mixed-Signal Design, IEEE, pp. 104-107.

* cited by examiner

*Primary Examiner* — Adolf Berhane
*Assistant Examiner* — Fred E Finch, III
(74) *Attorney, Agent, or Firm* — Dugan & Dugan, PC

(57) ABSTRACT

Methods and apparatus are described that develop a reference voltage that is based on a difference between a threshold voltage of a first transistor and a threshold voltage of a second transistor, and further based on a difference between a gate overdrive voltage of the first transistor and a gate overdrive voltage of the second transistor.

20 Claims, 8 Drawing Sheets

METHODS AND APPARATUS FOR GENERATING VOLTAGE REFERENCES USING TRANSISTOR THRESHOLD DIFFERENCES

BACKGROUND

In many integrated circuits, such as memory devices, it is necessary to have an on-chip reference voltage that is stable over process and temperature variations. As semiconductor technology advances, semiconductor geometries are decreasing. In particular, with the scaling of semiconductor technologies and the use of ultra-thin gate oxides, the demand for low power and low voltage reference circuits is increasing.

In prior art integrated circuits, a band gap reference circuit has typically been used as a general-purpose voltage regulator circuit for supplying a stable voltage reference. However, conventional band gap reference circuits typically cannot operate at power supply voltages less than about 1.0 volts. Thus, as semiconductor technologies advance and as operating voltages decrease, traditional band gap reference techniques may not be adequate.

As a result, there is a need for voltage reference circuits for use in low voltage integrated circuit applications.

SUMMARY

Methods in accordance with this invention include a method for developing a reference voltage that is based on a difference between a threshold voltage of a first transistor and a threshold voltage of a second transistor, and further based on a difference between a gate overdrive voltage of the first transistor and a gate overdrive voltage of the second transistor.

Methods in accordance with this invention also include a method for making a product incorporating a voltage reference circuit, the method including forming a reference voltage circuit configured to generate a reference voltage based on a difference between a threshold voltage of a first transistor and a threshold voltage of a second transistor, and further based on a difference between a gate overdrive voltage of the first transistor and a gate overdrive voltage of the second transistor.

Apparatus in accordance with this invention include a reference voltage circuit including a first transistor and a second transistor, and a means for generating a reference voltage based on a difference between a threshold voltage of the first transistor and a threshold voltage of the second transistor, and further based on a difference between a gate overdrive voltage of the first transistor and a gate overdrive voltage of the second transistor.

Apparatus in accordance with this invention also include a circuit including a reference voltage output node, and a means for developing a reference voltage on the output node that is based on a difference in a respective threshold voltage of a first transistor and a second transistor, and further based on a difference in a respective gate overdrive voltage of the first transistor and the second transistor.

Apparatus in accordance with this invention also include a circuit including first and second supply nodes, a first circuit leg including a first transistor coupled between the first supply node and the second supply node, and a second circuit leg including a second transistor coupled between the first supply node and the second supply node. The first circuit leg conducts a current, and the second circuit leg conducts substantially the same current. The second transistor includes a first output node that provides a reference voltage that is based on a difference between respective threshold voltages of the first transistor and the second transistor, and further based on a difference between respective gate overdrive voltages of the first transistor and the second transistor.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Methods and apparatus in accordance with this invention develop a reference voltage that is based on a difference between a threshold voltage of a first transistor and a threshold voltage of a second transistor, and further based on a difference between a gate overdrive voltage of the first transistor and a gate overdrive voltage of the second transistor.

Figure 1:
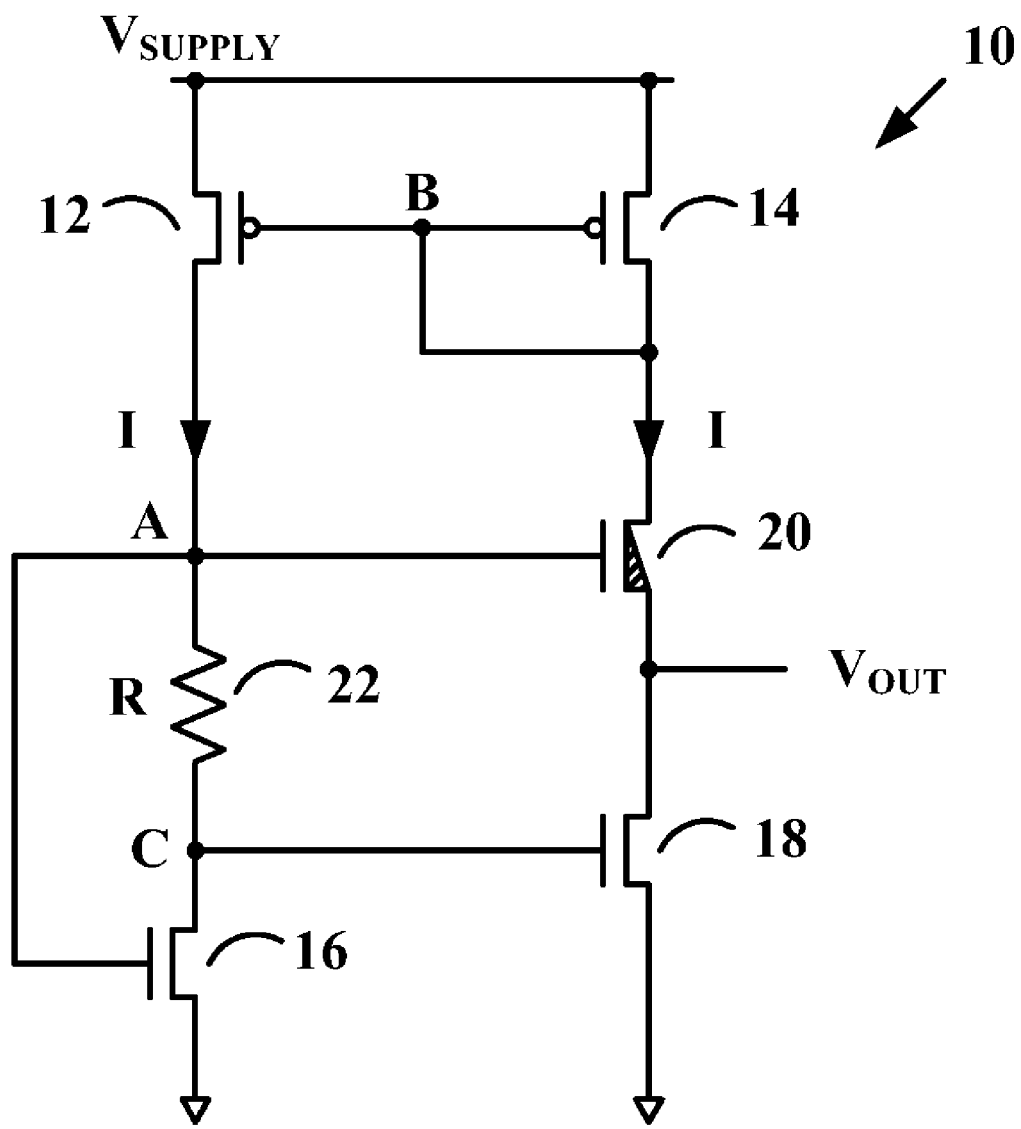
FIG. 1 is a circuit diagram of an exemplary voltage reference circuit in accordance with this invention.

Referring now to FIG. 1, a first exemplary voltage reference circuit 10 in accordance with this invention is described. Voltage reference circuit 10 includes p-channel transistors 12 and 14, n-channel transistors 16 and 18, native n-channel transistor 20 and resistor 22. P-channel transistor 12 has a drain terminal coupled to node A, a gate terminal coupled to node B, and a source terminal coupled to a first supply node, $V_{SUPPLY}$. P-channel transistor 14 has a drain and a gate terminal coupled to node B, and a source terminal coupled to $V_{SUPPLY}$. P-channel transistors 12 and 14 form a current mirror, with each transistor conducting substantially the same drain current I.

N-channel transistor 16 has a drain terminal coupled to node C, a gate terminal coupled to node A, and a source terminal coupled to a second supply node, GROUND. N-channel transistor 18 has a drain terminal coupled to node $V_{OUT}$, a gate terminal coupled to node C, and a source terminal coupled to GROUND. Native n-channel transistor 20 has a drain terminal coupled to node B, a gate terminal coupled to node A, and a source terminal coupled to node $V_{OUT}$. Resistor 22 has a resistance R, and has a first terminal coupled to node A, and a second terminal coupled to node C. Native n-channel transistor 20, sometimes referred to as a depletion-mode transistor, has a threshold voltage $V_{T20}$ having a nominal value of approximately zero volts. Transistors 16 and 18 are n-channel transistors having threshold voltages $V_{T16}$ and $V_{T18}$, respectively, that are each greater than zero volts. Transistors 16, 18 and 20 each conduct substantially the same drain current I.

The circuit elements in voltage reference circuit 10 have the following exemplary parameters:

| $V_{SUPPLY}$ = 3.3 V |
| --- |
| R = 60 KΩ |
| $\left(\frac{W}{L}\right)_{12} = \left(\frac{W}{L}\right)_{14} = \left(\frac{24}{6}\right)$ |
| $\left(\frac{W}{L}\right)_{16} = \left(\frac{12}{12}\right)$ |
| $\left(\frac{W}{L}\right)_{18} = \left(\frac{W}{L}\right)_{20} = \left(\frac{48}{12}\right)$ |

Persons of ordinary skill in the art will understand that circuit elements having parameter values other than these exemplary values also may be used.

From the circuit diagram of FIG. 1, the voltage across resistor 22 may be expressed as:

$$IR = (V_{GS16} - V_{GS18}) \tag{1}$$

where $V_{GS16}$ and $V_{GS18}$ are the gate-to-source voltages of transistors 16 and 18, respectively. In saturation, the gate-to-source voltage of an MOS transistor may be written as:

$$V_{GS} = V_T + \sqrt{\frac{2I_D}{\beta}} \tag{2}$$

where $V_T$ is the transistor threshold voltage, and the square-root term is typically referred to as the "gate overdrive voltage." The gate overdrive voltage of the transistor is a function of the transistor drain current, $I_D$, and the transistor $\beta$, which may be written as:

$$\beta = \mu \text{Cox}\left(\frac{W}{L}\right) \tag{3}$$

where $\mu$, Cox, and $$\left(\frac{W}{L}\right)$$

are the transistor's carrier mobility, gate oxide capacitance per unit area and gate width-to-length ratio, respectively.

Thus, if transistors 16 and 18 are biased to operate in saturation, $V_{GS16}$ and $V_{GS18}$ can be written as:

$$V_{GS16} = \left(V_{T16} + \sqrt{\frac{2I}{\beta_{16}}}\right) \tag{4}$$

$$V_{GS18} = \left(V_{T18} + \sqrt{\frac{2I}{\beta_{18}}}\right) \tag{5}$$

where $\beta_{16}$ and $\beta_{18}$ are the "betas" of transistors 16 and 18, respectively.

From equations (1), (4) and (5), the voltage across resistor 22 can be rewritten as:

$$IR = \left(V_{T16} + \sqrt{\frac{2I}{\beta_{16}}}\right) - \left(V_{T18} + \sqrt{\frac{2I}{\beta_{18}}}\right) \tag{6}$$

If transistors 16 and 18 are fabricated near one another on the same die, $V_{T16} \approx V_{T18}$. Thus, $$IR = \sqrt{\frac{2I}{\beta_{16}}}\left(1 - \frac{1}{\sqrt{\beta_{18}/\beta_{16}}}\right) \tag{7}$$

Let $$M = \frac{\beta_{18}}{\beta_{16}} \tag{8}$$

Then from equations (7) and (8), $$IR = \sqrt{\frac{2I}{\beta_{16}}}\left(1 - \frac{1}{\sqrt{M}}\right) \tag{9}$$

For nonzero I, $M \geq 1$. If $\mu_{18} = \mu_{16}$, and $Cox_{18} = Cox_{16}$, then:

$$M = \frac{\left(\frac{W}{L}\right)_{18}}{\left(\frac{W}{L}\right)_{16}} \tag{10}$$

Thus, M equals the ratio of transistor width-to-length ratios, and is thus a substantially temperature-independent constant.

Let $$K_1 = \left(1 - \frac{1}{\sqrt{M}}\right),$$

which is also a substantially temperature-independent constant. Then from equation (9), $$IR = \sqrt{\frac{2I}{\beta_{16}}} K_1 \tag{11}$$

therefore, solving for I, $$I = \frac{2K_1^2}{\beta_{16}R^2} \tag{12}$$

From FIG. 1, $$V_{OUT} = (V_{GS16} - V_{GS20}) \tag{13}$$

where $V_{GS20}$ is the gate-to-source voltage of native n-channel transistor 20. If transistor 20 is biased to operate in saturation, $V_{GS20}$ can be written as:

$$V_{GS20} = \left(V_{T20} + \sqrt{\frac{2I}{\beta_{20}}}\right) \quad (14)$$

where $\beta_{20}$ is the beta of transistor 20, which may be written as:

$$\beta_{20} = \mu_{20} Cox_{20} \left(\frac{W}{L}\right)_{20} \quad (15)$$

Thus, from equations (4), (13) and (14):

$$V_{OUT} = \left(V_{T16} + \sqrt{\frac{2I}{\beta_{16}}}\right) - \left(V_{T20} + \sqrt{\frac{2I}{\beta_{20}}}\right) \quad (16)$$

$$= (V_{T16} - V_{T20}) + \left(\sqrt{\frac{2I}{\beta_{16}}} - \sqrt{\frac{2I}{\beta_{20}}}\right) \quad (17)$$

Thus, $V_{OUT}$ is equal to a difference between the threshold voltage of transistor 16 and the threshold voltage of transistor 20, plus a difference between the gate overdrive voltage of transistor 16 and the gate overdrive voltage of transistor 20. Substituting equation (12) into equation (17), $$V_{OUT} = (V_{T16} - V_{T20}) + \left(\sqrt{\frac{4K_1^2}{\beta_{16}^2 R^2}} - \sqrt{\frac{4K_1^2}{\beta_{20}\beta_{16}R^2}}\right) \quad (18)$$

$$= (V_{T16} - V_{T20}) + \frac{2K_1}{R}\left(\frac{1}{\beta_{16}} - \frac{1}{\sqrt{\beta_{16}\beta_{20}}}\right) \quad (19)$$

Let $J = \beta_{20}/\beta_{16}$, then:

$$V_{OUT} = (V_{T16} - V_{T20}) + \frac{2K_1}{R}\left(\frac{1}{\beta_{16}} - \frac{1}{\sqrt{J\beta_{20}^2}}\right) \quad (20)$$

$$= (V_{T16} - V_{T20}) + \frac{2K_1}{R}\frac{1}{\beta_{16}}\left(1 - \frac{1}{\sqrt{J}}\right) \quad (21)$$

$$= (V_{T16} - V_{T20}) + \frac{2K_1 K_2}{R}\frac{1}{\beta_{16}} \quad (22)$$

where, $$K_2 = \left(1 - \frac{1}{\sqrt{J}}\right) \quad (23)$$

if $Cox_{16} \times \left(\frac{W}{L}\right)_{16} = Cox_{20} \times \left(\frac{W}{L}\right)_{20}$, then $$J = \frac{\mu_{20}}{\mu_{16}} \quad (24)$$

which is a ratio of transistor mobilities. If transistors 16 and 20 are fabricated near one another on the same die, $\mu_{20}$ tracks $\mu_{16}$ over process and temperature. Thus, to a first order approximation, J is temperature-independent, and $K_2$ is temperature-independent.

Let $$\Delta V_T = (V_{T16} - V_{T20}) \quad (25)$$

and $$K_3 = \frac{2K_1 K_2}{R} \quad (26)$$

ignoring the temperature-dependence of R, $K_3$ is a temperature-independent constant. Thus, rewriting equation (22):

$$V_{OUT} = \Delta V_T + \frac{K_3}{\beta_{16}} \quad (27)$$

The second term on the right side of equation (26) is a constant divided by the beta of n-channel transistor 16.

Figure 2:
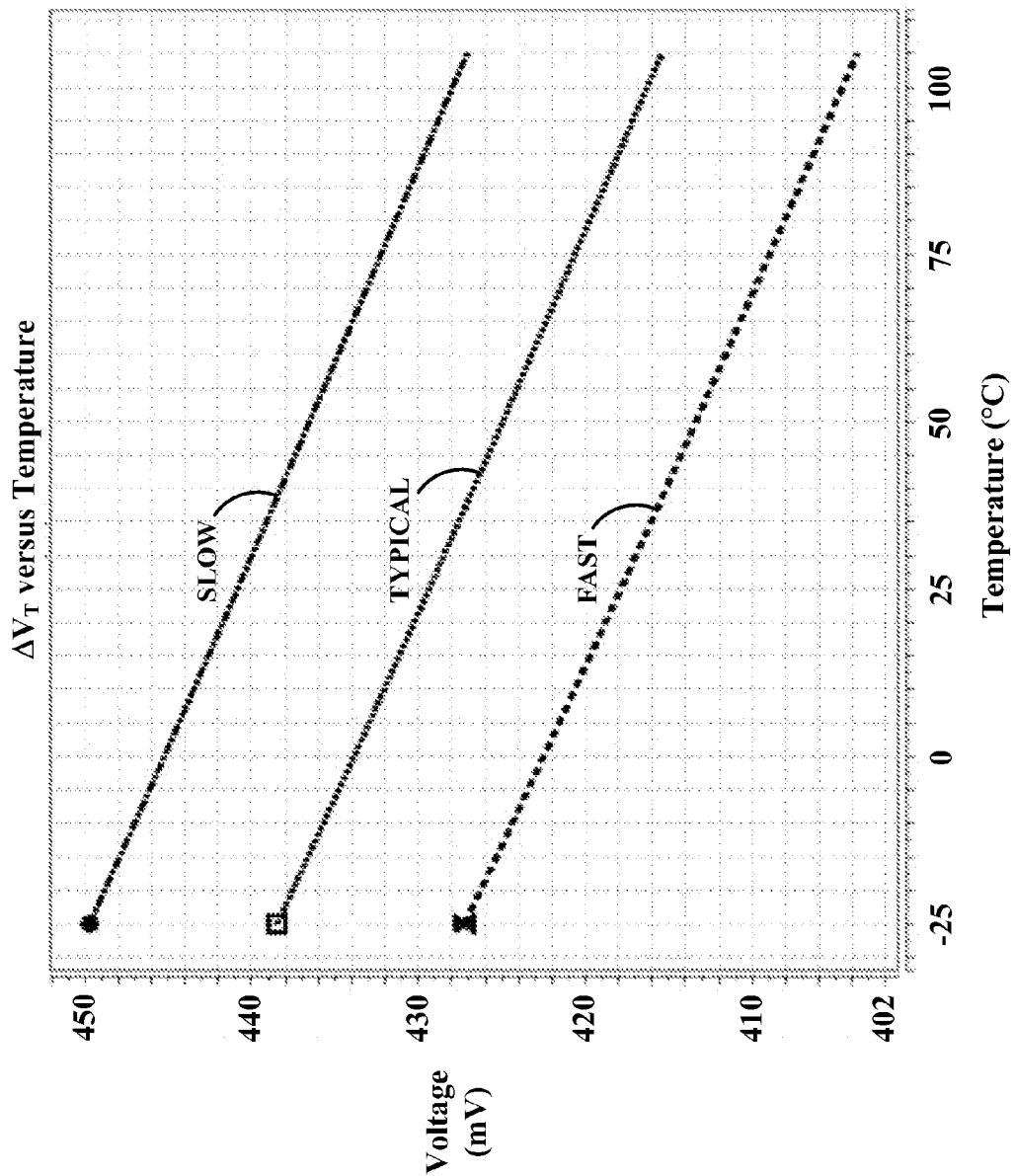
FIG. 2 is a graph of a difference between respective threshold voltages of transistors 16 and 20 of FIG. 1 over process and temperature.

FIG. 2 shows a graph of $\Delta V_T$ versus temperature, which shows that $\Delta V_T$ is approximately linear, and decreases with increasing temperature. That is, $\Delta V_T$ is conversely proportional to absolute temperature ("CTAT"). In the specific example shown, the slope of $\Delta V_T$ is approximately −0.18 mV/° C. over process and a temperature range from about −25 to about +100 degrees Celsius.

Figure 3:
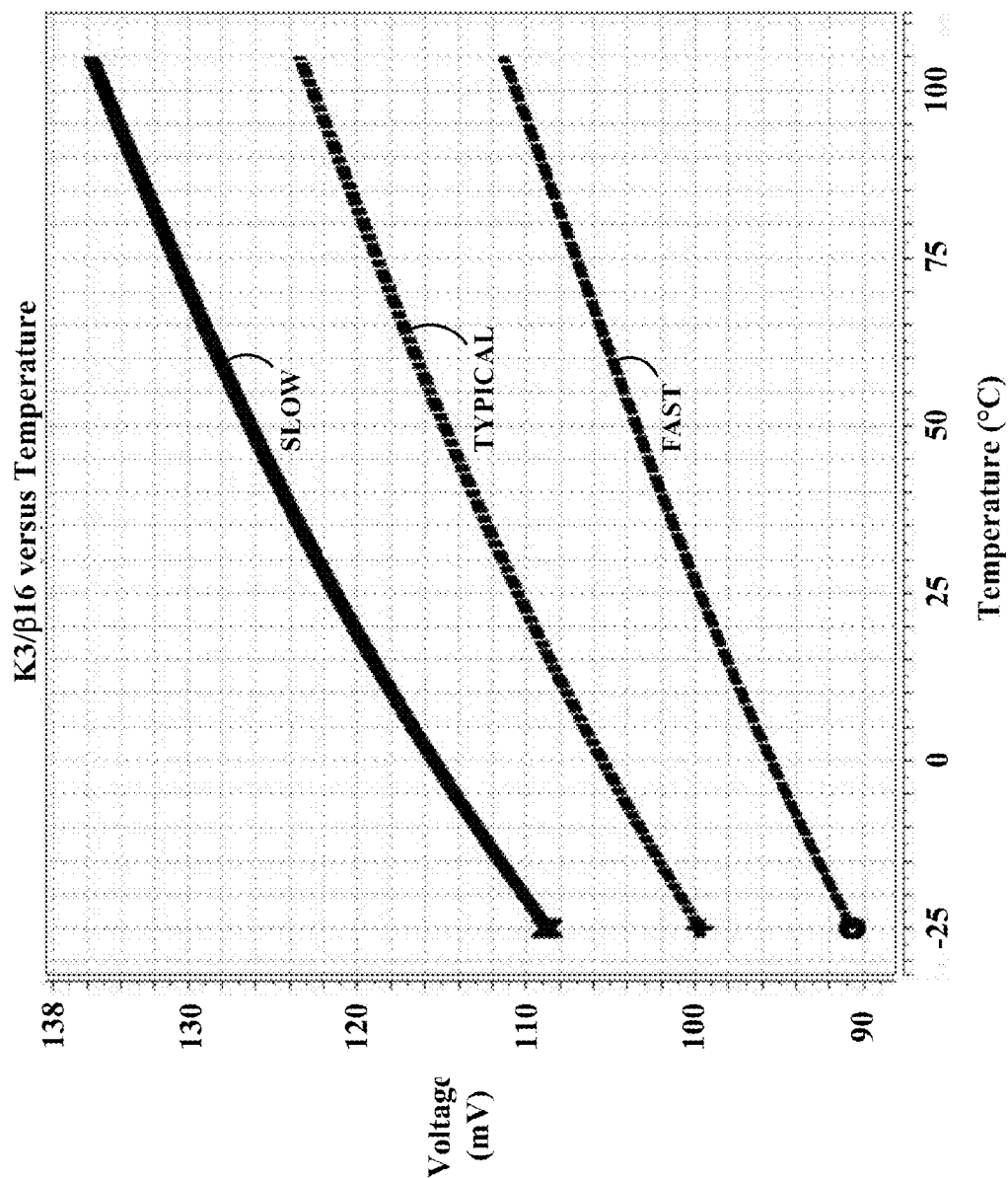
FIG. 3 is a graph of a difference between respective gate overdrive voltages of transistors 16 and 20 of FIG. 1 over process and temperature.

In contrast, FIG. 3 shows a graph of $K_3/\beta_{16}$ versus temperature, which shows that $K_3/\beta_{16}$ is approximately linear, and increases with increasing temperature. That is, $K_3/\beta_{16}$ is proportional to absolute temperature ("PTAT"). The constant $K_3$ may be adjusted to set the slope of the $K_3/\beta_{16}$ curve to any desired value. For example, by using a circuit simulator (e.g., SPICE, PSpice, hSpice, etc.), $K_3$ can be set so that slope of the $K_3/\beta_{16}$ curve is approximately +0.18 mV/° C. over process and a temperature range from about −25 to about +100 degrees Celsius. Thus, $V_{OUT}$ includes a CTAT term and a PTAT term, the slopes of which are approximately equal and opposite to one another. As will be illustrated below, $V_{OUT}$ is a reference voltage that is substantially independent of temperature variations.

Figure 4:
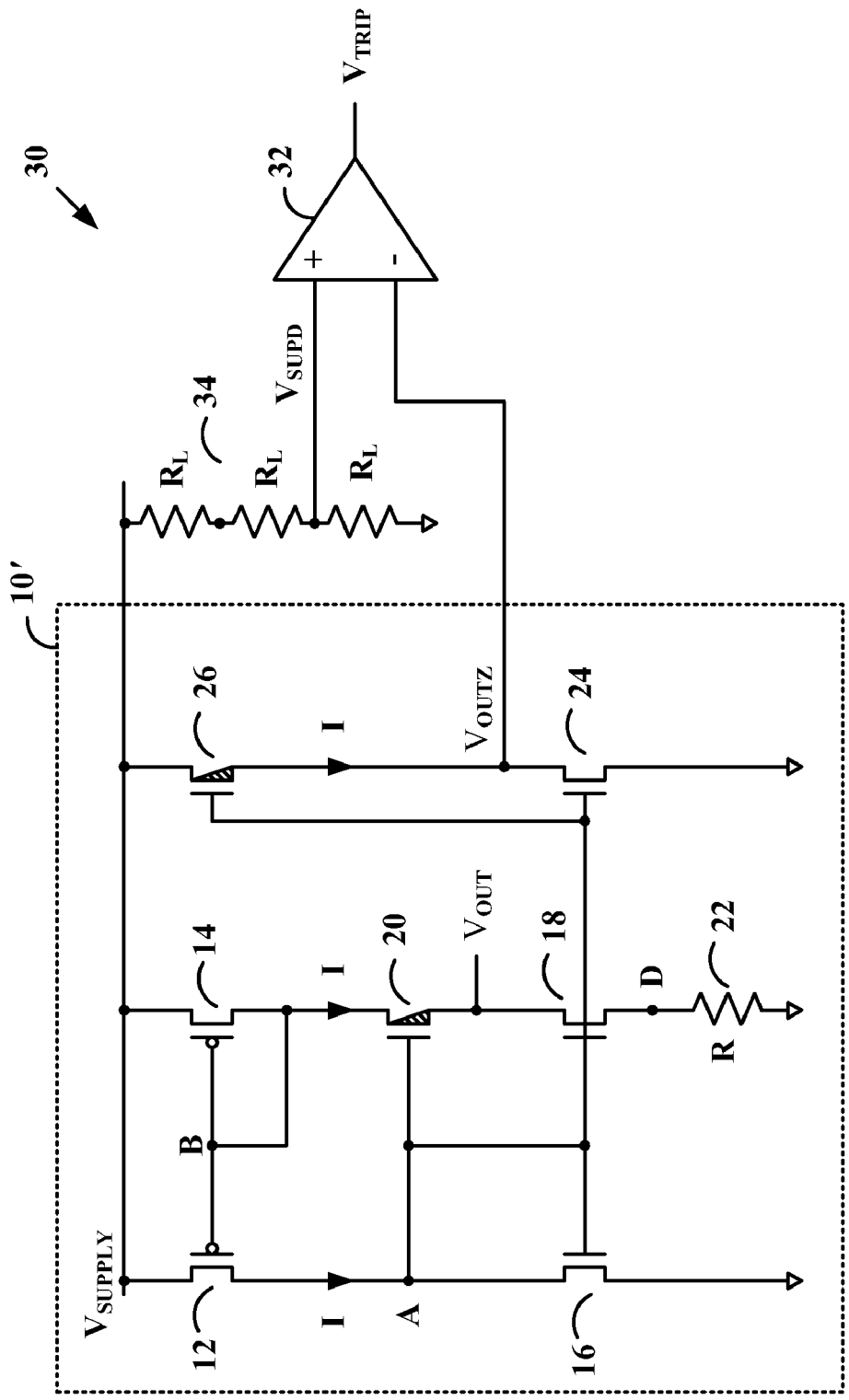
FIG. 4 is a circuit diagram of another exemplary voltage reference circuit in accordance with this invention.

Referring now to FIG. 4, an exemplary circuit 30 is described that includes a second exemplary voltage reference circuit 10' in accordance with this invention. Voltage reference circuit 10' is similar to voltage reference circuit 10, with the following modifications: (a) n-channel transistor 16 has a drain terminal and a gate terminal coupled to node A, and a source terminal coupled to GROUND; (b) n-channel transistor 18 has a drain terminal coupled to node $V_{OUT}$, a gate terminal coupled to node A, and a source terminal coupled to node D; and (c) resistor 22 has a first terminal coupled to node D, and a second terminal coupled to GROUND. In addition, voltage reference circuit 10' includes n-channel transistor 24 having a drain terminal coupled to node $V_{OUTZ}$, a gate terminal coupled to node A, and a source terminal coupled to GROUND, and a native n-channel transistor 26 having a drain terminal coupled to $V_{SUPPLY}$, a gate terminal coupled to node A, and a source terminal coupled to node $V_{OUTZ}$. Circuit 30 also includes a comparator 32 having an inverting input node coupled to node $V_{OUTZ}$, a non-inverting input node coupled to node $V_{SUPD}$ of voltage-divider circuit 34, and an output node $V_{TRIP}$.

The circuit elements in voltage reference circuit 10' have the following exemplary parameters:

$$\left(\frac{W}{L}\right)_{24} = \left(\frac{12}{12}\right)$$

$$\left(\frac{W}{L}\right)_{26} = \left(\frac{48}{12}\right)$$

Persons of ordinary skill in the art will understand that circuit elements having parameter values other than these exemplary values also may be used.

Figure 5:
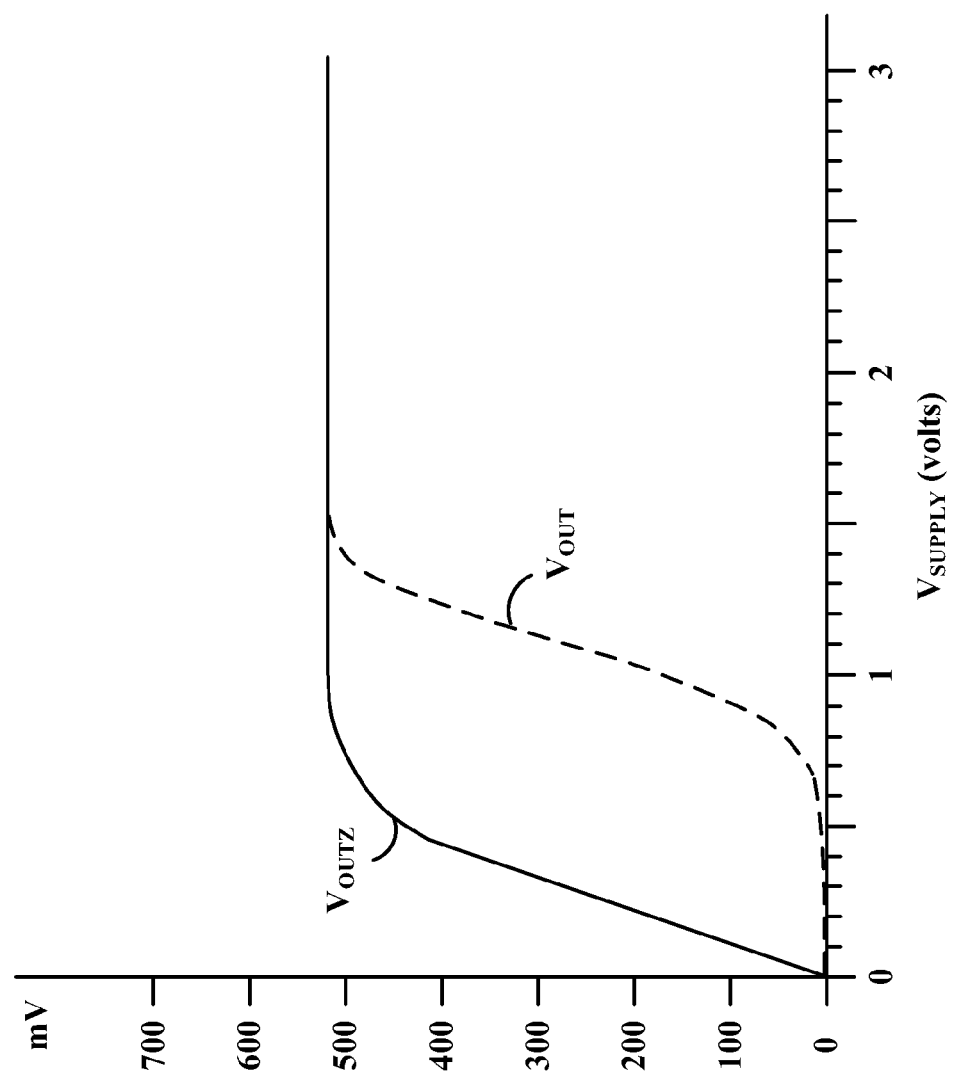
FIG. 5 is a graph of the output reference voltages of the circuit of FIG. 4.

Persons of ordinary skill in the art will understand that voltage reference circuit 10' is an equivalent circuit to voltage reference circuit 10. As illustrated in FIG. 5, as $V_{SUPPLY}$ increases, $V_{OUT}$ begins to increase when $V_{SUPPLY}$ is approximately 500 mV, and settles to a reference voltage of about 538 mV when $V_{SUPPLY}$ is greater than approximately 1.4 volts. Referring again to FIG. 4, persons of ordinary skill in the art will understand that $V_{OUTZ}$ is substantially equivalent to $V_{OUT}$, except that $V_{OUTZ}$ has more headroom, and can operate at lower $V_{SUPPLY}$ levels than $V_{OUT}$. Indeed, as shown in FIG. 5, $V_{OUTZ}$ is functional as a stable voltage reference when $V_{SUPPLY}$ is greater than about 800 mV.

Figure 6:
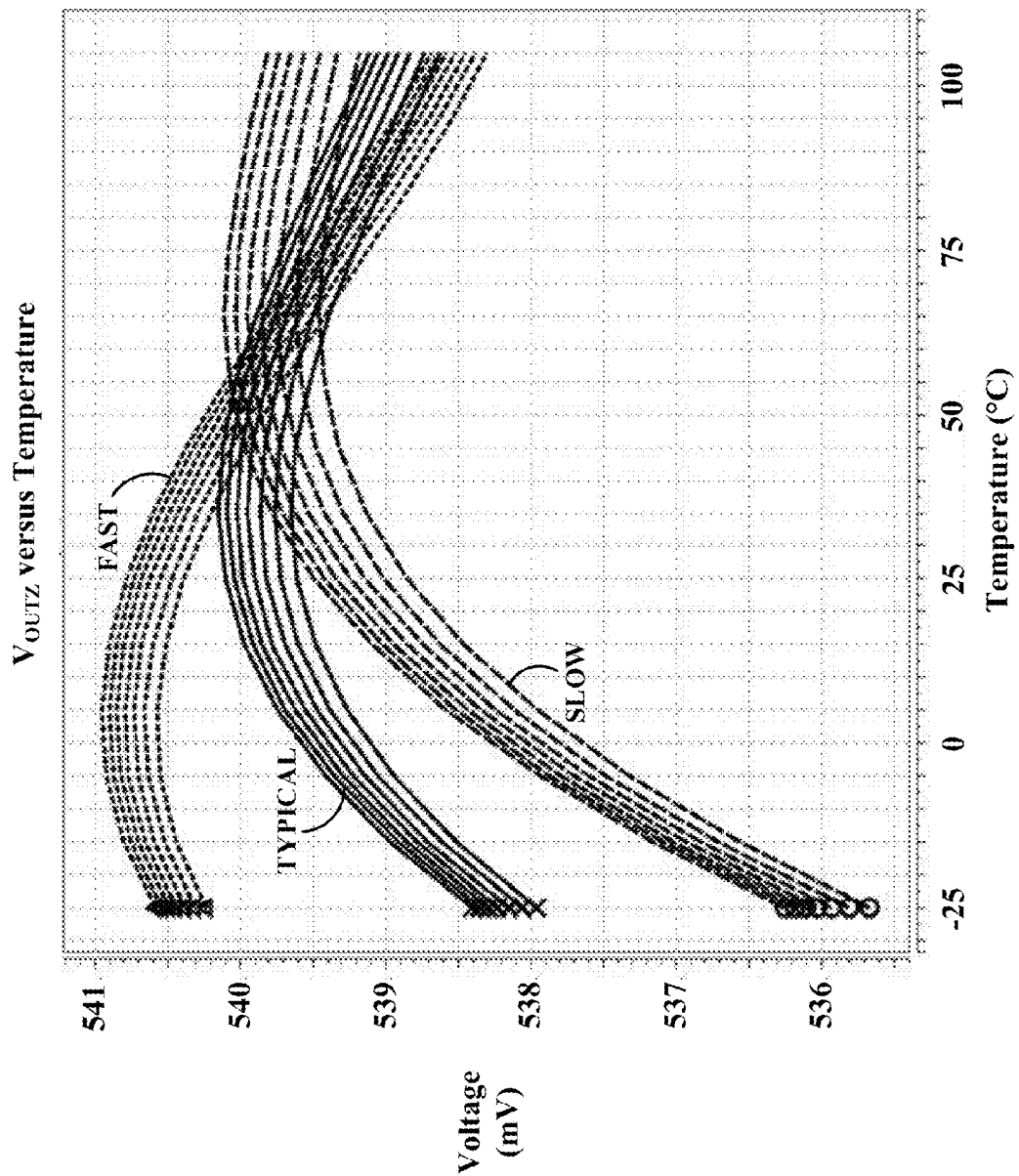
FIG. 6 is a graph of a reference voltage of the circuit of FIG. 4 over process and temperature.

As shown in FIG. 6, over process and a temperature range from about −25 to about +100 degrees Celsius, $V_{OUTZ}$ has a minimum value of about 535.5 mV, a maximum value of about 541.0 mV, and a difference of about 5.5 mV, which is approximately a 1% variation. This compares quite favorably with bandgap reference circuits, which typically require many more components and are much more complicated than exemplary voltage reference circuits 10 and 10', and typically exhibit a variation of 0.5% over process and temperature. Thus, $V_{OUTZ}$ also is reference voltage that is substantially independent of temperature variations.

Figure 7:
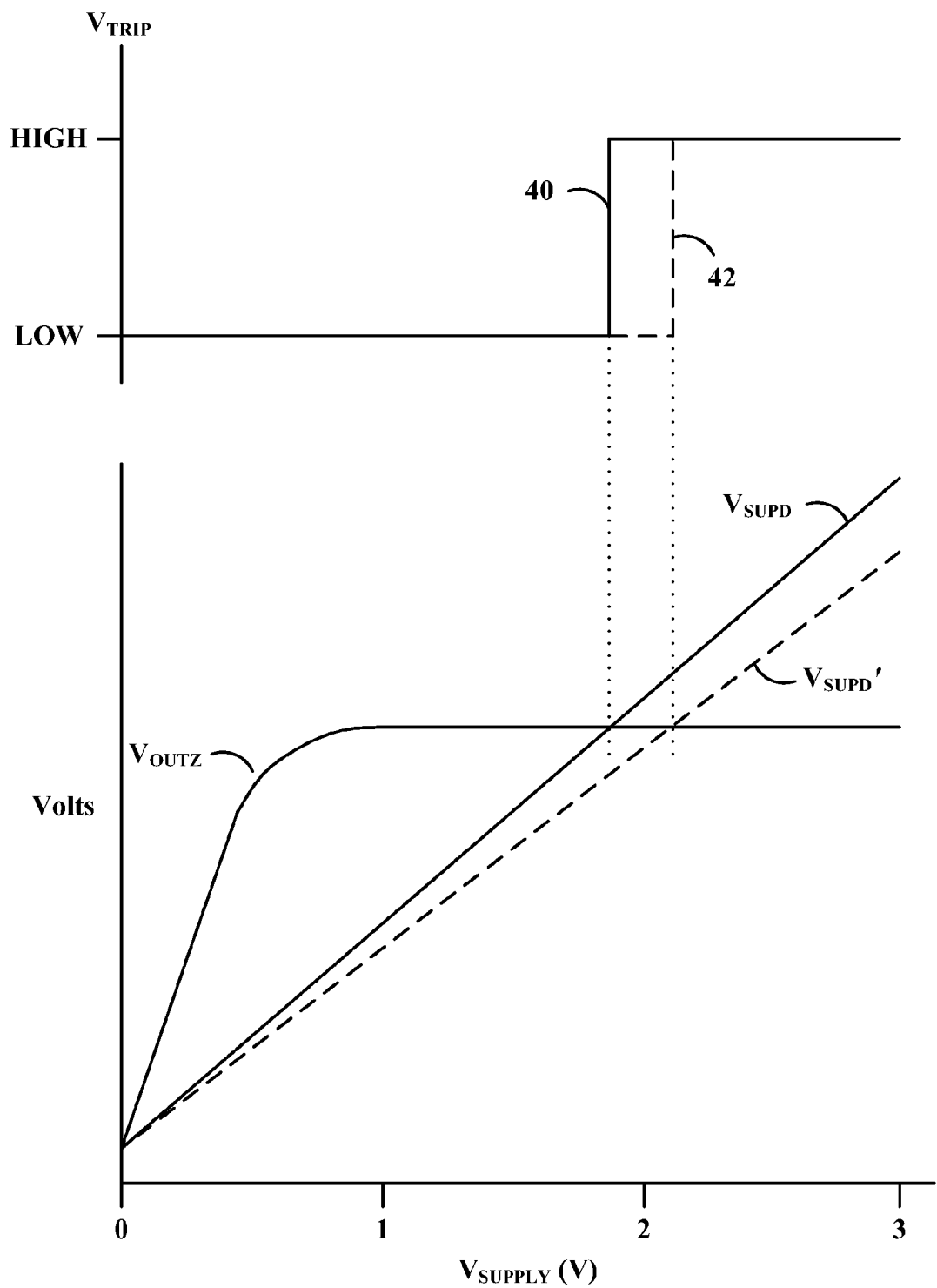
FIG. 7 is a graph of exemplary trip point output voltages of the circuit of FIG. 4.

Referring again to FIG. 4, circuit 30 also includes a comparator 32 having an output node $V_{TRIP}$, which may be used to indicate when reference voltage $V_{OUTZ}$ is "good," i.e., a stable reference voltage. In particular, as shown in FIG. 7, as supply voltage $V_{SUPPLY}$ increases from zero, $V_{SUPD}$ also increases, but at a rate determined by the ratio of resistor divider 34. $V_{TRIP}$ will remain LOW until $V_{SUPD}$ is greater than $V_{OUTZ}$, and then $V_{TRIP}$ will go HIGH at 40 to indicate that $V_{OUTZ}$ is good. The divider ratio of resistor-divider 34 may thus be used to control the point at which $V_{TRIP}$ switches from LOW to HIGH relative to $V_{SUPPLY}$. In exemplary circuit 30, voltage-divider 34 uses a ⅓ divider ratio, and hence $V_{TRIP}$ does not switch until $V_{SUPD} = V_{SUPPLY}/3$ exceeds $V_{OUTZ}$. Alternatively, as shown in FIG. 7, if resistor-divider 34 uses a ¼ divider ratio, $V_{TRIP}$ does not switch until $V_{SUPD}' = V_{SUPPLY}/4$ exceeds $V_{OUTZ}$, as shown at 42.

Referring again to FIG. 4, voltage divider circuit 34 is illustrated as a resistor divider. Persons of ordinary skill in the art will understand that voltage divider circuit alternatively may be implemented using diode-connected transistors instead of resistors $R_L$.

In the exemplary circuits described above, a voltage reference was created based on a difference between a threshold voltage of a first transistor and a threshold voltage of a second transistor, and further based on a difference between a gate overdrive voltage of the first transistor and a gate overdrive voltage of the second transistor. Persons of ordinary skill in the art will understand that alterative voltage reference circuits in accordance with this invention may generate a voltage reference by summing a difference between a threshold voltage of a first transistor and a threshold voltage of a second transistor with any suitable proportional to absolute temperature voltage.

Figure 8:
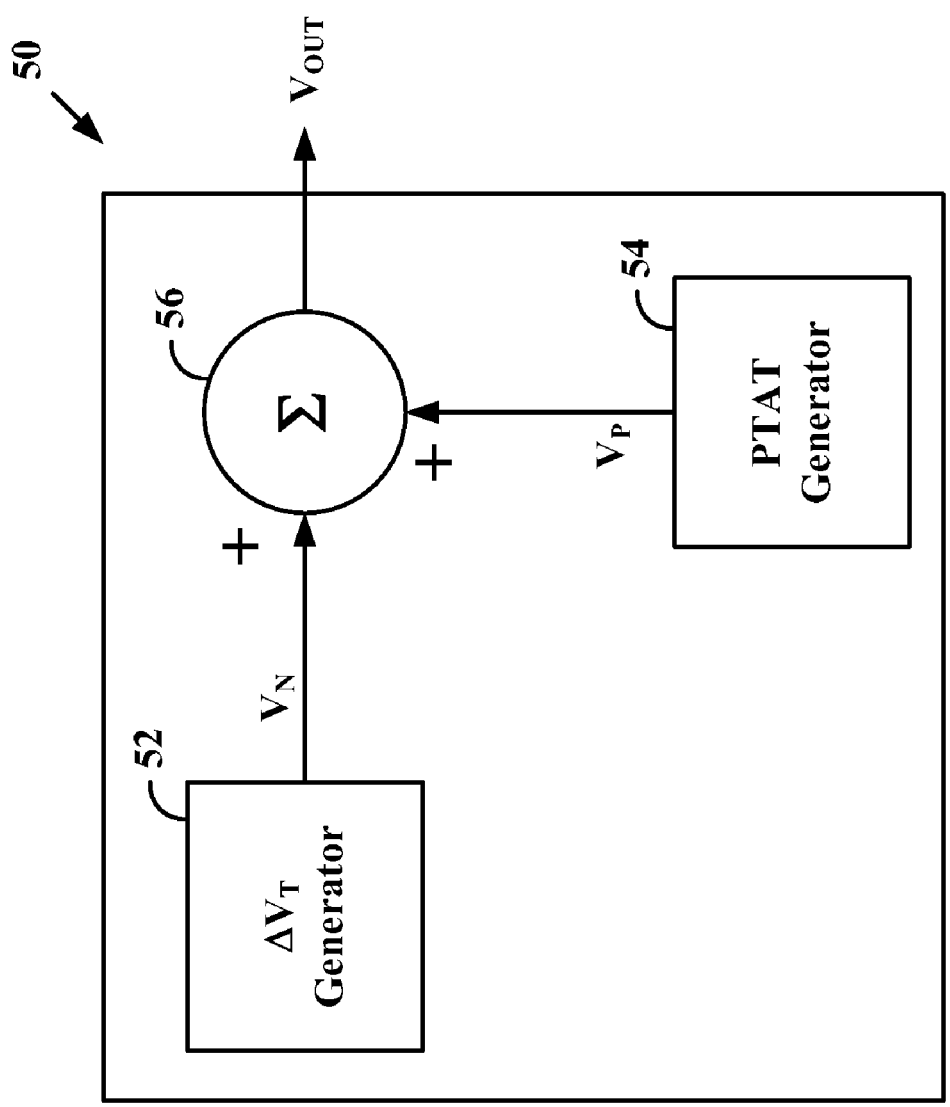
FIG. 8 is a block diagram of another exemplary voltage reference circuit in accordance with this invention.

Thus, as shown in FIG. 8, voltage reference circuit 50 includes $\Delta V_T$ generator 52, PTAT generator 54, and summer 56. $\Delta V_T$ generator 52 generates a voltage $V_N$ equal to a difference between a threshold voltage of a first transistor and a threshold voltage of a second transistor, and that has a first slope over process and temperature. PTAT generator 54 generates a voltage $V_P$ that is proportional to absolute temperature and has a second slope over process and temperature that is substantially equal in magnitude and opposite in sign to the first slop. Summer 56 provides an output reference voltage $V_{OUT}$ that is substantially independent of temperature variations.

In the exemplary circuits described above, PTAT generator 54 generated a voltage equal to a difference between a gate overdrive voltage of a first transistor and a gate overdrive voltage of a second transistor. Persons of ordinary skill in the art also will understand that alternative voltage reference circuits in accordance with this invention may eliminate the gate overdrive term, and adjust the difference in threshold voltages to create a temperature insensitive voltage. For example, a voltage reference circuit that generates $$V_{OUT} = 0.85 \times V_{T16} - V_{T20} \tag{28}$$

creates a very temperature-insensitive voltage reference. The value of $V_{OUT}$ may, however, be process-dependent, but that may be accommodated using a trimming amplifier.

Although circuits and physical structures are generally presumed, it is well recognized that in modern semiconductor design and fabrication, physical structures and circuits may be embodied in computer readable descriptive form suitable for use in subsequent design, test or fabrication activities as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The claimed invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. Moreover, the embodiments described above are specifically contemplated to be used alone as well as in various combinations. It is only the following claims, including all equivalents, that are intended to define the scope of this invention. Accordingly, other embodiments, variations, and improvements not described herein are not necessarily excluded from the scope of the invention.

The invention claimed is:

1. A method comprising:
developing a reference voltage that is based on a difference between a threshold voltage of a first transistor and a threshold voltage of a second transistor, and further based on a difference between a gate overdrive voltage of the first transistor and a gate overdrive voltage of the second transistor, wherein:
the difference between the threshold voltage of the first transistor and the threshold voltage of the second transistor is a conversely proportional to absolute temperature voltage;
the difference between the gate overdrive voltage of the first transistor and the gate overdrive voltage of the second transistor is a proportional to absolute temperature voltage;
the reference voltage is substantially independent of temperature variations; and
the first transistor has a gate terminal coupled to a gate terminal of the second transistor.

2. The method as recited in claim 1, wherein the reference voltage is substantially independent of a power supply voltage operably applied to the circuit, for values of the power supply voltage greater than a predetermined value.

3. The method as recited in claim 1, wherein the first and second transistors comprise transistors having identical conductivity type.

4. The method as recited in claim 1, wherein the first and second transistors comprise N-channel transistors having respective threshold voltages that are nominally non-negative in value.

5. The method as recited in claim 1, further comprising comparing the reference voltage to a voltage derived from a power supply voltage, and for generating a signal to indicate that the derived voltage exceeds the reference voltage.

6. A method for making a product incorporating a voltage reference circuit, the method comprising:
forming a reference voltage circuit configured to generate a reference voltage based on a difference between a threshold voltage of a first transistor and a threshold voltage of a second transistor, and further based on a difference between a gate overdrive voltage of the first transistor and a gate overdrive voltage of the second transistor, wherein:
the difference between the threshold voltage of the first transistor and the threshold voltage of the second transistor is a conversely proportional to absolute temperature voltage;
the difference between the gate overdrive voltage of the first transistor and the gate overdrive voltage of the second transistor is a proportional to absolute temperature voltage;
the reference voltage is substantially independent of temperature variations; and
the first transistor has a gate terminal coupled to a gate terminal of the second transistor.

7. The method of claim 6, further comprising selecting component values to achieve a voltage reference that is stable for values of its power supply voltage greater than about 1.4 volts.

8. The method of claim 6, further comprising selecting component values to achieve a voltage reference that is stable for values of its power supply voltage greater than about 800 millivolts.

9. A reference voltage circuit comprising:
a first transistor and a second transistor, wherein the first transistor has a gate terminal coupled to a gate terminal of the second transistor; and
a means for generating a reference voltage based on a difference between a threshold voltage of the first transistor and a threshold voltage of the second transistor, and further based on a difference between a gate overdrive voltage of the first transistor and a gate overdrive voltage of the second transistor, wherein:
the difference between the threshold voltage of the first transistor and the threshold voltage of the second transistor is a conversely proportional to absolute temperature voltage;
the difference between the gate overdrive voltage of the first transistor and the gate overdrive voltage of the second transistor is a proportional to absolute temperature voltage; and
the reference voltage is substantially independent of temperature variations.

10. The circuit of claim 9, wherein the reference voltage is substantially independent of a power supply voltage operably applied to the circuit, for values of the power supply voltage greater than a predetermined value.

11. The circuit of claim 9, wherein the first and second transistors comprise transistors having identical conductivity type.

12. The circuit of claim 9, wherein the first and second transistors comprise N-channel transistors having respective threshold voltages that are nominally non-negative in value.

13. The circuit of claim 9, further comprising a comparator adapted to compare the reference voltage to a voltage derived from a power supply voltage, and to generate a signal to indicate that the derived voltage exceeds the reference voltage.

14. The circuit of claim 9, embodied in a computer-readable form suitable for design, test, or manufacturing of an integrated circuit.

15. A circuit comprising:
a reference voltage output node; and
means for developing a reference voltage on the output node that is based on a difference in a respective threshold voltage of a first transistor and a second transistor, and further based on a difference in a respective gate overdrive voltage of the first transistor and the second transistor, wherein:
the difference between the threshold voltage of the first transistor and the threshold voltage of the second transistor is a conversely proportional to absolute temperature voltage;
the difference between the gate overdrive voltage of the first transistor and the gate overdrive voltage of the second transistor is a proportional to absolute temperature voltage;
the reference voltage is substantially independent of temperature variations; and
the first transistor has a gate terminal coupled to a gate terminal of the second transistor.

16. A circuit comprising:
first and second supply nodes;
a first circuit leg comprising a first transistor coupled between the first supply node and the second supply node, wherein the first circuit leg conducts a current; and
a second circuit leg comprising a second transistor coupled between the first supply node and the second supply node, wherein the second circuit leg conducts substantially the current;

wherein:
the second transistor comprises a first output node that provides a reference voltage that is based on a difference between respective threshold voltages of the first transistor and the second transistor, and further based on a difference between respective gate overdrive voltages of the first transistor and the second transistor;
the difference between the threshold voltage of the first transistor and the threshold voltage of the second transistor is a conversely proportional to absolute temperature voltage;
the difference between the gate overdrive voltage of the first transistor and the gate overdrive voltage of the second transistor is a proportional to absolute temperature voltage;
the reference voltage is substantially independent of temperature variations; and
the first transistor has a gate terminal coupled to a gate terminal of the second transistor.

17. The circuit of claim 16, wherein:
the first transistor is of a first conductivity type, and has a first threshold voltage; and
the second transistor is of the first conductivity type, and has a second threshold voltage less than the first threshold voltage.

18. The circuit of claim 16, further comprising:
a third circuit leg comprising a third transistor coupled between the first supply node and the second supply node, wherein the third circuit leg conducts substantially the current;
wherein the third transistor comprises a second output node that provides a second reference voltage that is based on a difference between respective threshold voltages of the first transistor and the second transistor, and further based on a difference between respective gate overdrive voltages of the first transistor and the second transistor.

19. The circuit of claim 18, wherein the second reference voltage varies by less than about 1% over a process and temperature range from 25 to +100 degrees Celsius.

20. The circuit of claim 18, further comprising a comparator circuit for comparing the second reference voltage to a voltage derived from the voltage conveyed on the first supply node, and for generating a signal to indicate that the derived voltage exceeds the second reference voltage.

* * * * *